(12) United States Patent  
Shimodaira et al.

(10) Patent No.: US 7,218,036 B2
(45) Date of Patent: May 15, 2007

(54) PIEZOELECTRIC OSCILLATOR, MANUFACTURING METHOD THEREFOR, MOBILE PHONE APPARATUS USING PIEZOELECTRIC OSCILLATOR, AND ELECTRONIC APPARATUS USING PIEZOELECTRIC OSCILLATOR

(75) Inventors: Kazuhiko Shimodaira, Minowa-machi (JP); Yugo Koyama, Ina (JP); Juichiro Matsuzawa, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 156 days.

(21) Appl. No.: 10/865,970

(22) Filed: Jun. 14, 2004

(65) Prior Publication Data

US 2005/0012559 A1    Jan. 20, 2005

(30) Foreign Application Priority Data

Jun. 16, 2003  (JP) .............................. 2003-170897
Mar. 11, 2004  (JP) .............................. 2004-069256

(51) Int. Cl.
*H01L 41/08* (2006.01)
(52) U.S. Cl. ...................................... 310/340; 310/344
(58) Field of Classification Search ................ 310/340, 310/344, 348
See application file for complete search history.

(56) References Cited

U.S. PATENT DOCUMENTS

| | | | | |
|---|---|---|---|---|
| 4,035,673 | A |  | 7/1977 | Ishida et al. |
| 5,166,570 | A | * | 11/1992 | Takahashi ................ 310/320 |
| 5,327,104 | A | * | 7/1994 | Kikushima ................ 331/68 |
| 5,541,557 | A | * | 7/1996 | Ikeda et al. ................ 331/158 |
| 5,631,609 | A | * | 5/1997 | Oka et al. ................ 331/68 |
| 5,892,417 | A | * | 4/1999 | Johnson et al. ................ 333/193 |
| 6,215,229 | B1 |  | 4/2001 | Kuroda et al. |
| 6,445,254 | B1 | * | 9/2002 | Shibuya et al. ................ 331/68 |
| 6,456,168 | B1 | * | 9/2002 | Luff ................ 331/68 |
| 6,833,654 | B2 | * | 12/2004 | Rubach ................ 310/344 |
| 2001/0022488 | A1 |  | 9/2001 | Kawauchi et al. |

FOREIGN PATENT DOCUMENTS

| | | |
|---|---|---|
| GB | 2055232 A | 2/1981 |
| JP | A-54-129996 | 10/1979 |
| JP | A 64-82507 | 3/1989 |
| JP | A-02-211705 A | 8/1990 |
| JP | A 7-162236 | 6/1995 |
| JP | A-2001-102886 | 4/2001 |
| JP | A-2002-076815 | 3/2002 |
| JP | A 2003-229720 | 8/2003 |
| TW | 466827 | 5/1999 |

* cited by examiner

*Primary Examiner*—Mark Budd
(74) *Attorney, Agent, or Firm*—Oliff & Berridge, PLC

(57) ABSTRACT

The invention provides a piezoelectric oscillator that allows for fine adjustment of the frequency after resin molding, a manufacturing method therefor, and a mobile phone and an electronic apparatus using the piezoelectric oscillator. The piezoelectric oscillator can include a resonator package, in which a piezoelectric resonator element is housed, and a semiconductor device, in which an oscillation circuit that is electrically connected to the resonator package is incorporated. The resonator package and the semiconductor device can be fixed to corresponding different surfaces of an island portion of a lead frame, and resin molding is performed so that a transparent lid of the resonator package is exposed to the outside.

8 Claims, 16 Drawing Sheets

[FIG. 1]
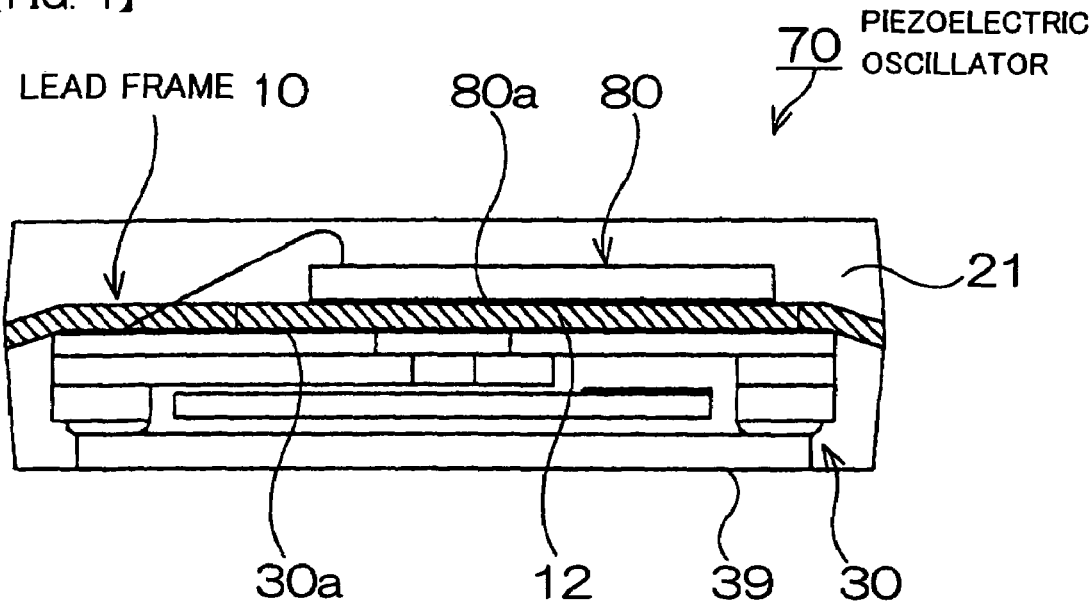
[FIG. 2]
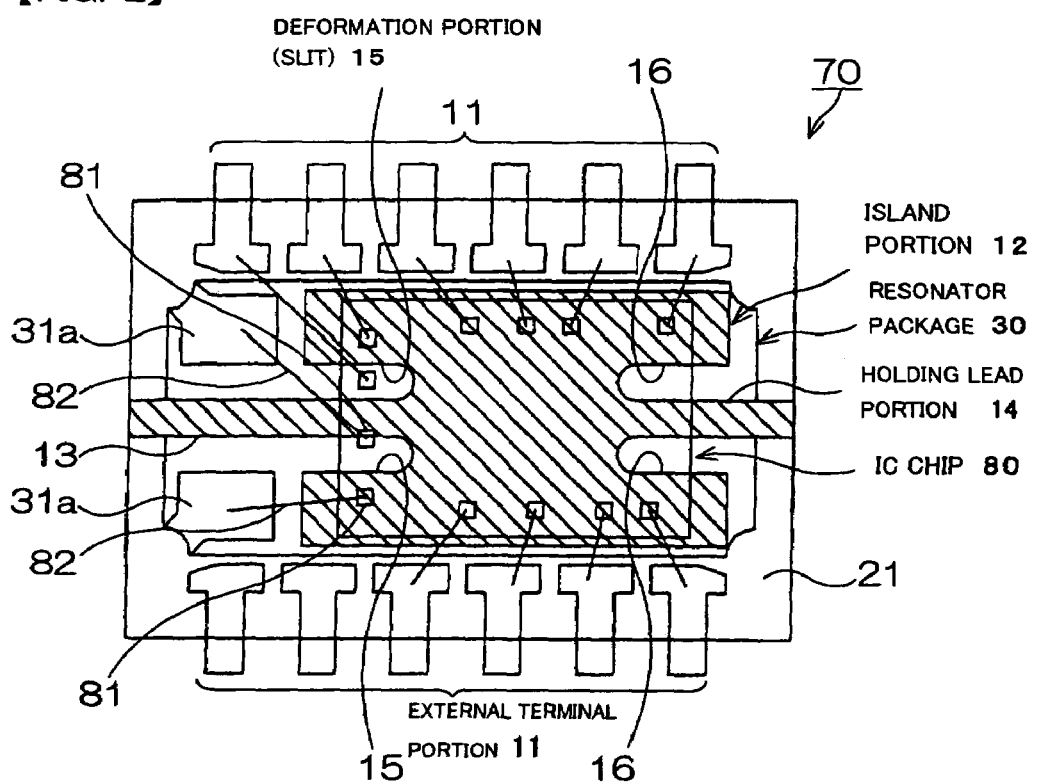

[FIG. 3]
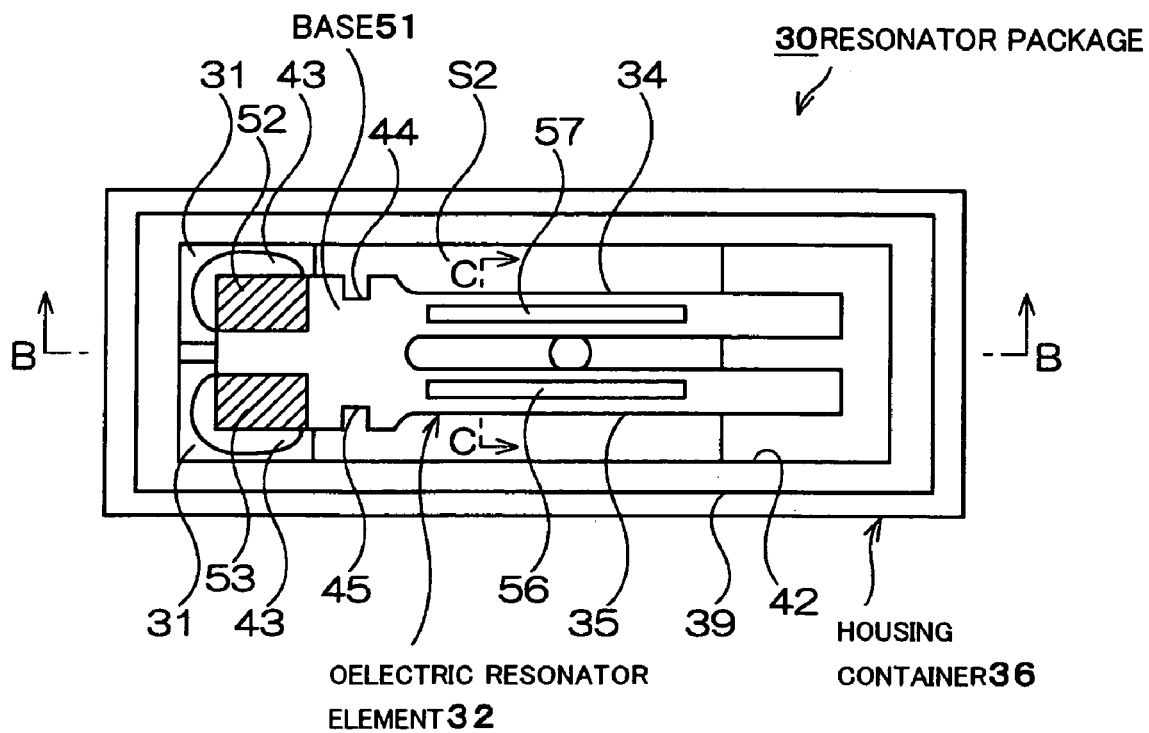
[FIG. 4]
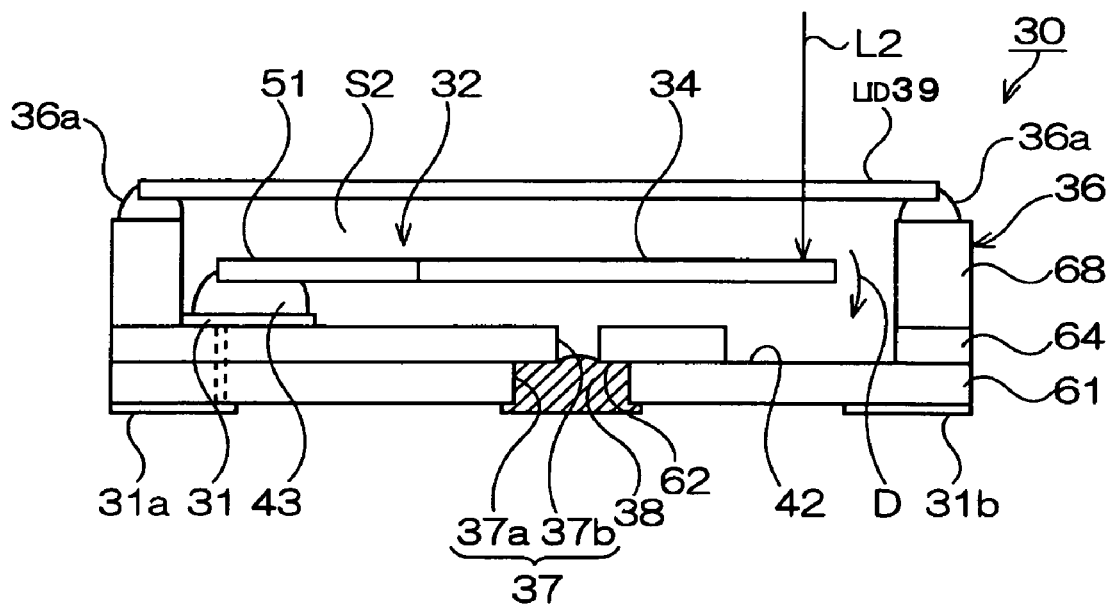

[FIG. 5]
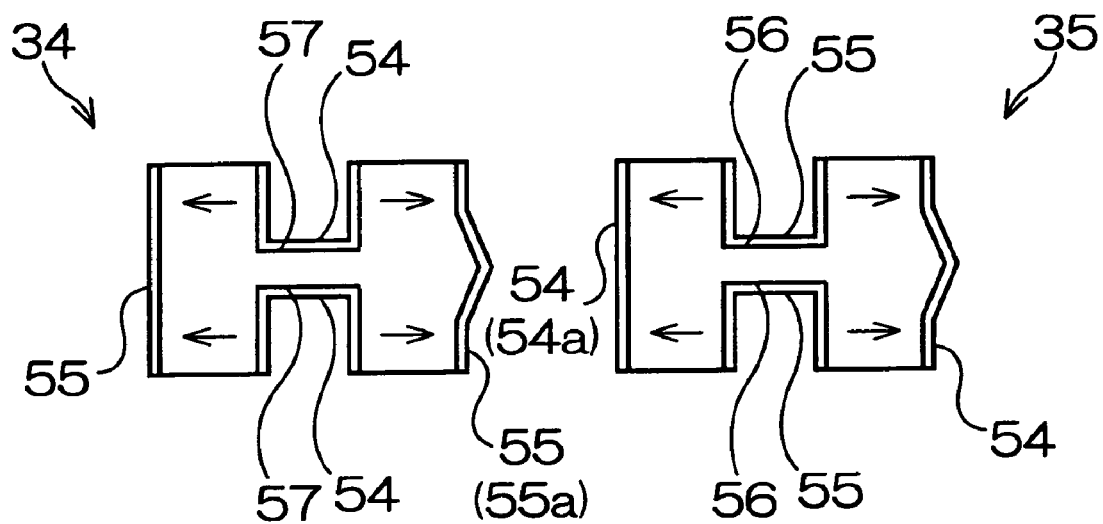
[FIG. 6]
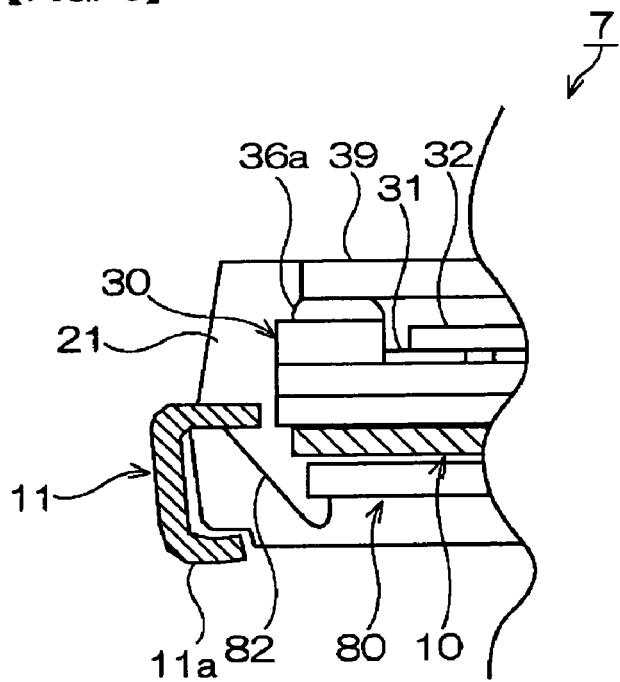

[FIG. 7]
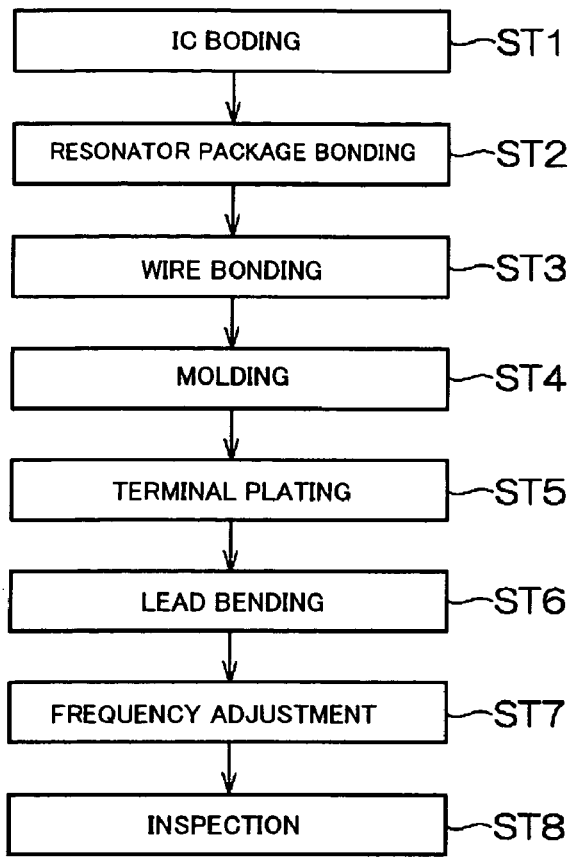
[FIG. 8]
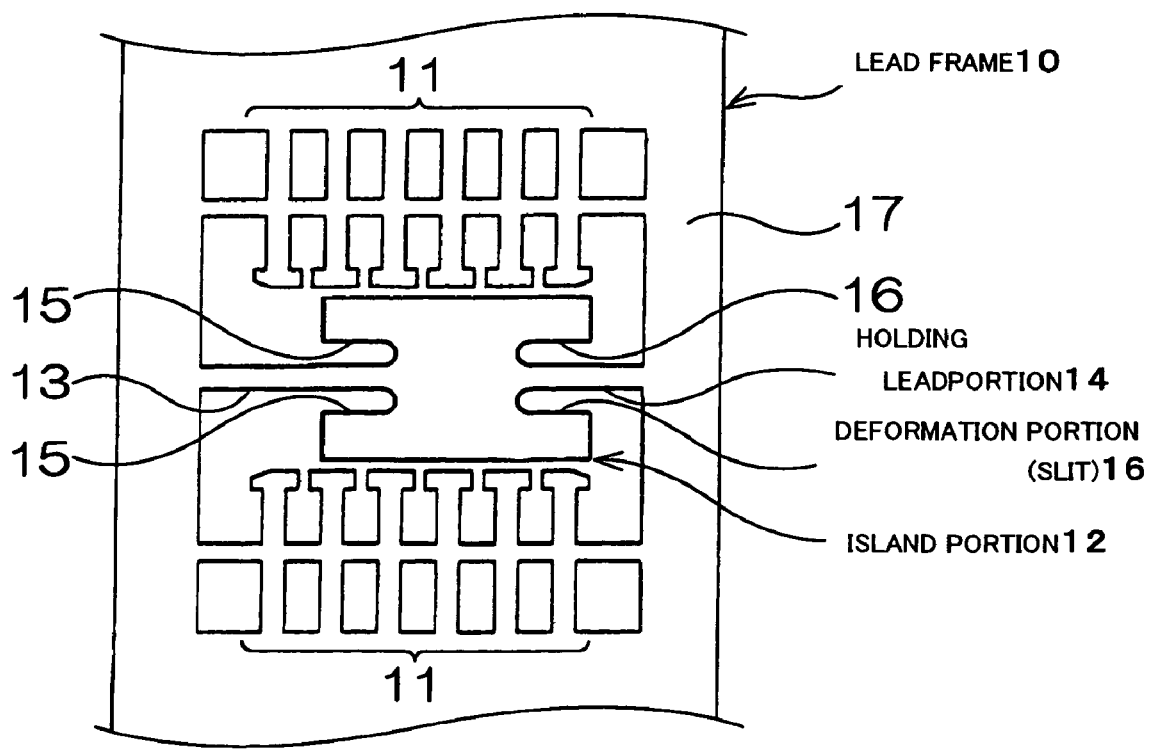

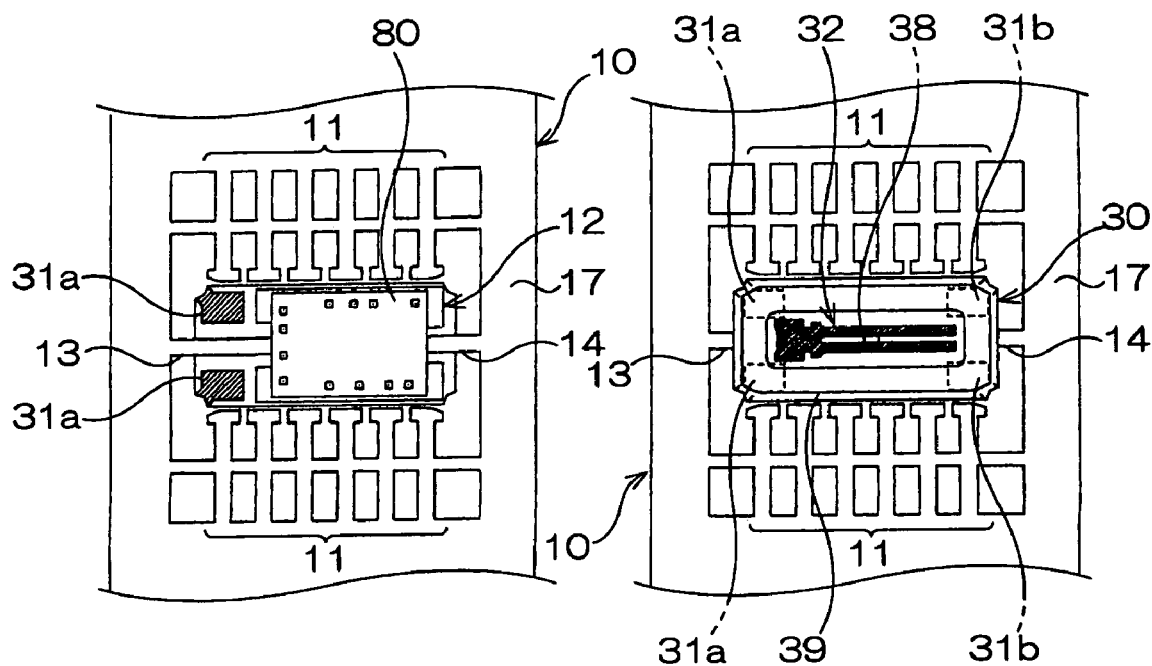
[FIG. 9a]   [FIG. 9b]

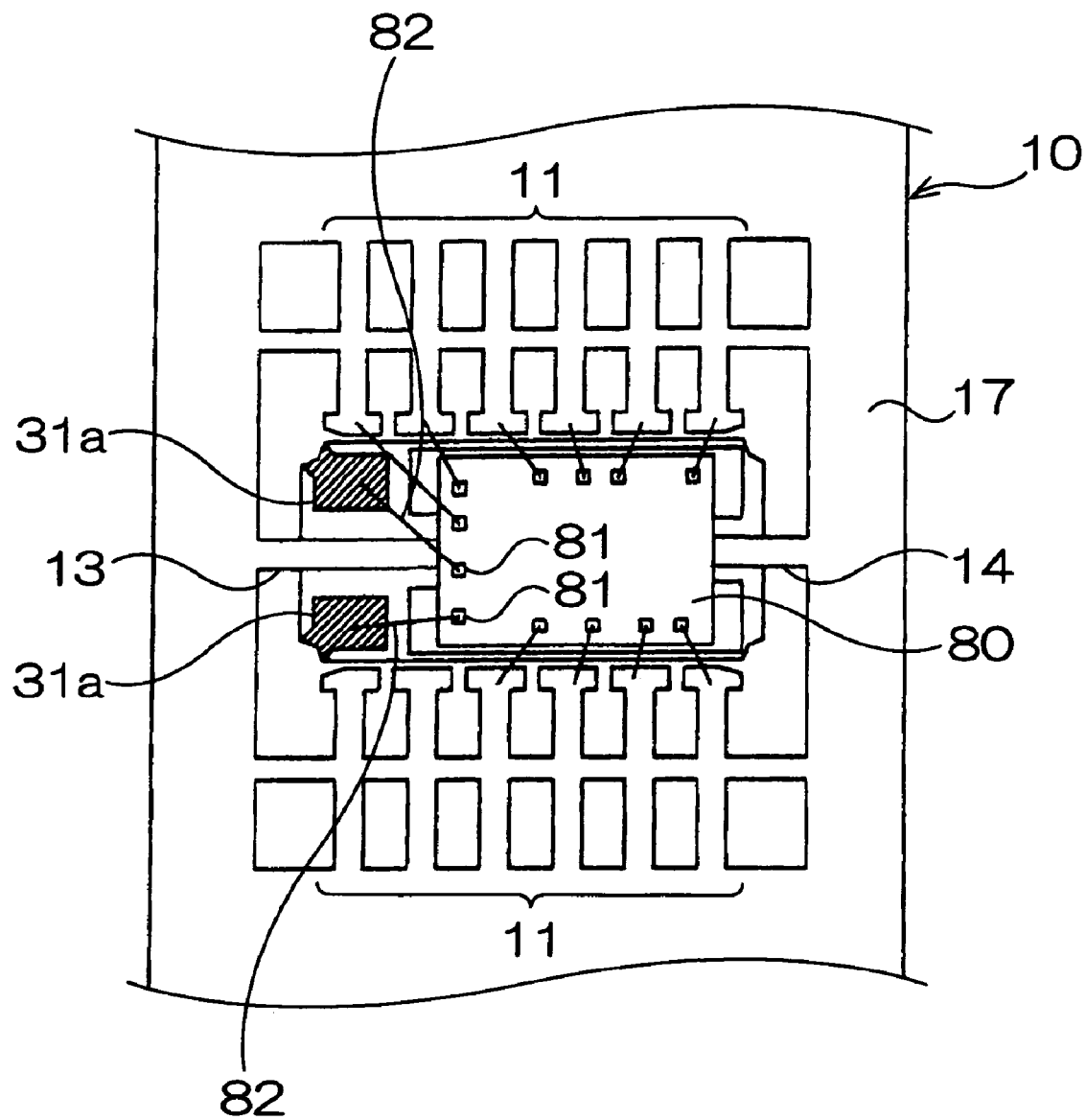
[FIG. 10]

[FIG. 11]
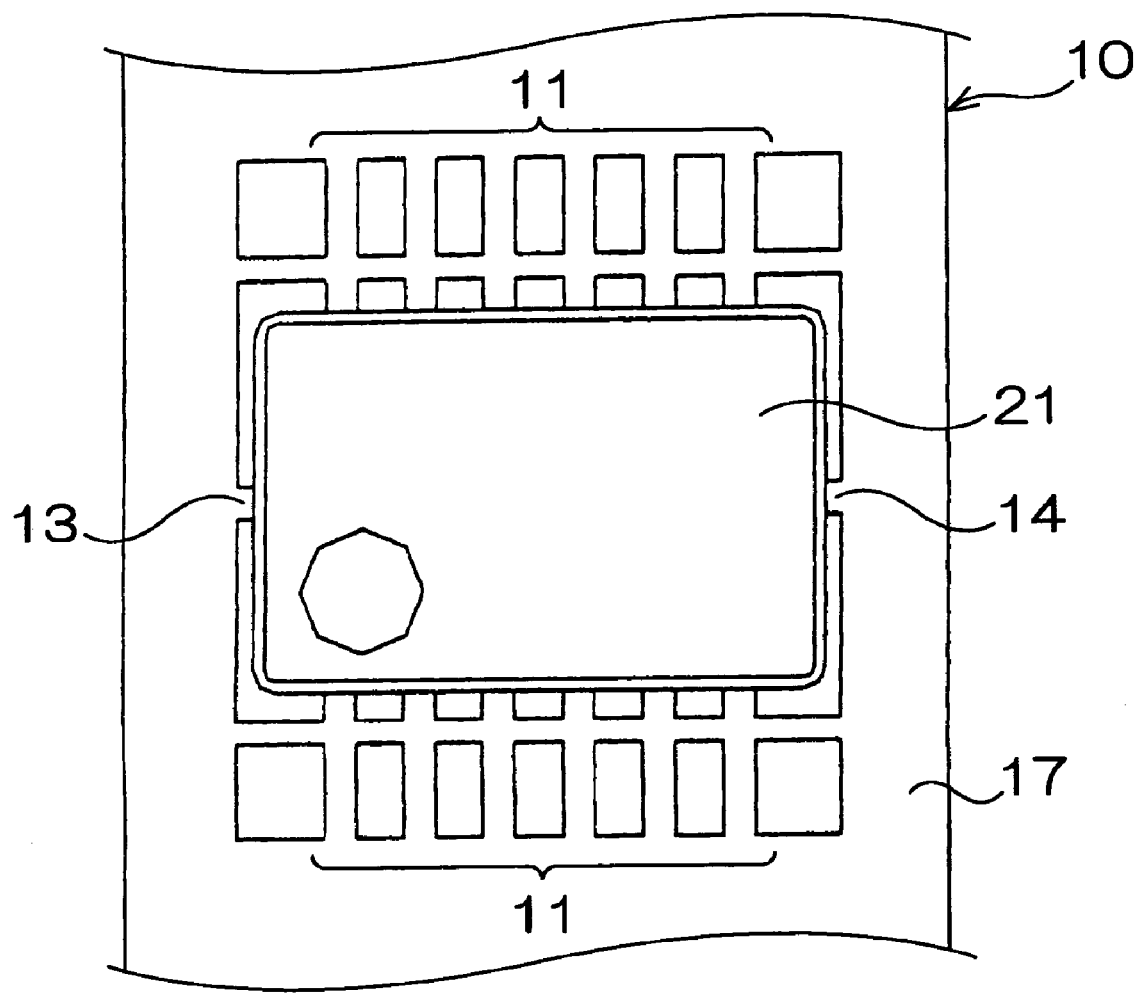

[FIG. 12]
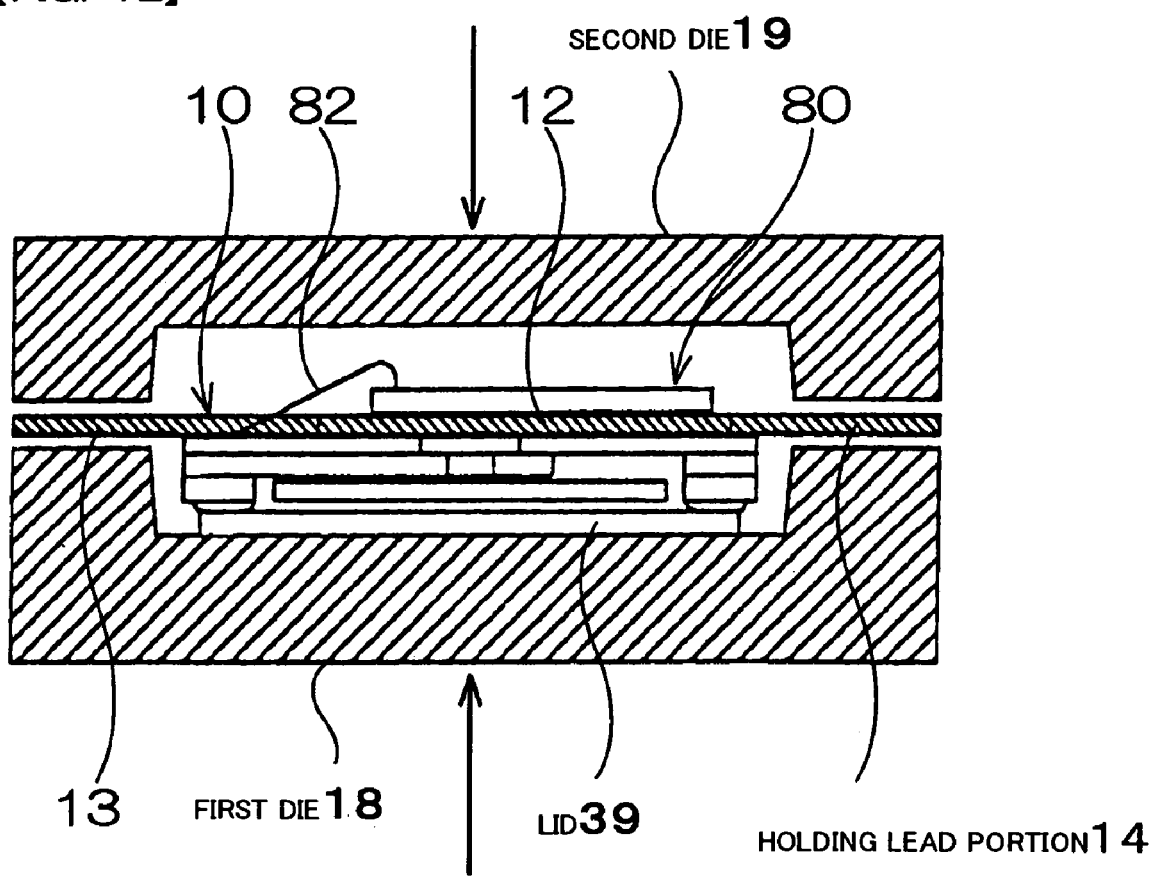

[FIG. 13]
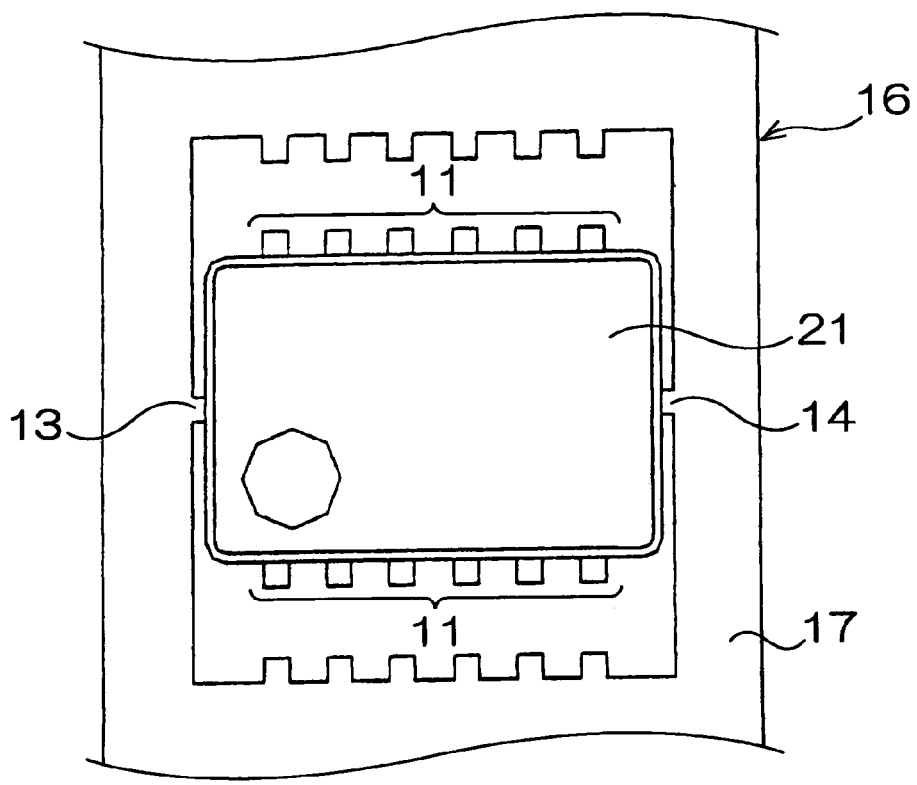
[FIG. 14]
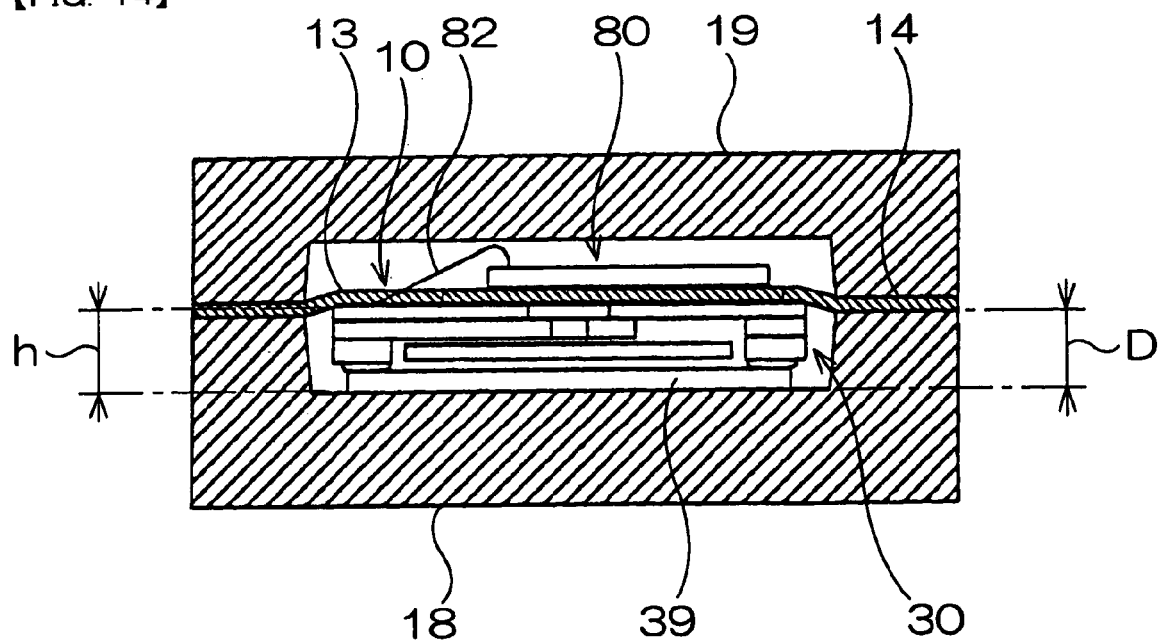

[FIG. 15]
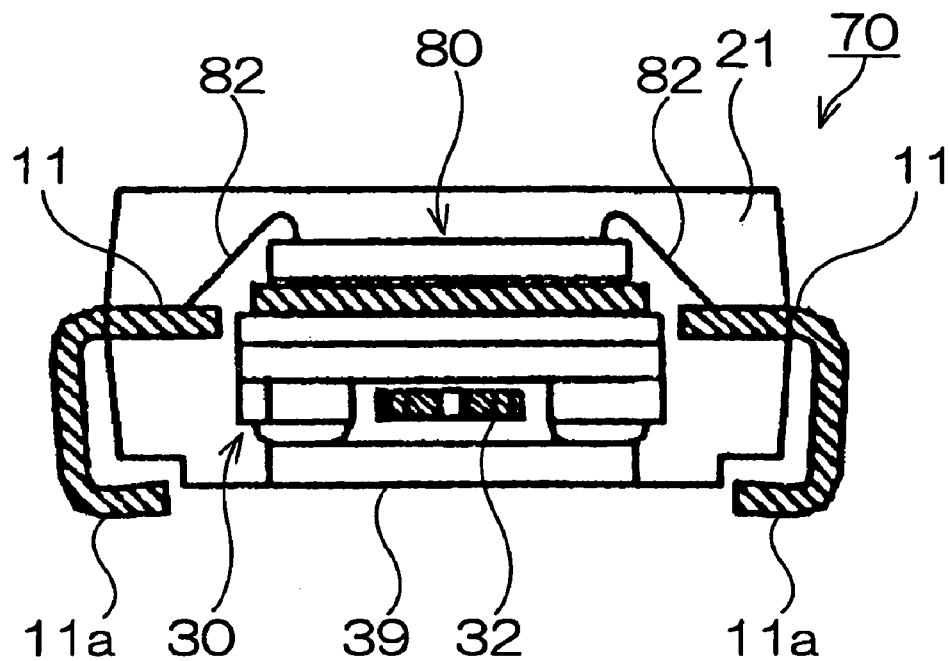
[FIG. 16]
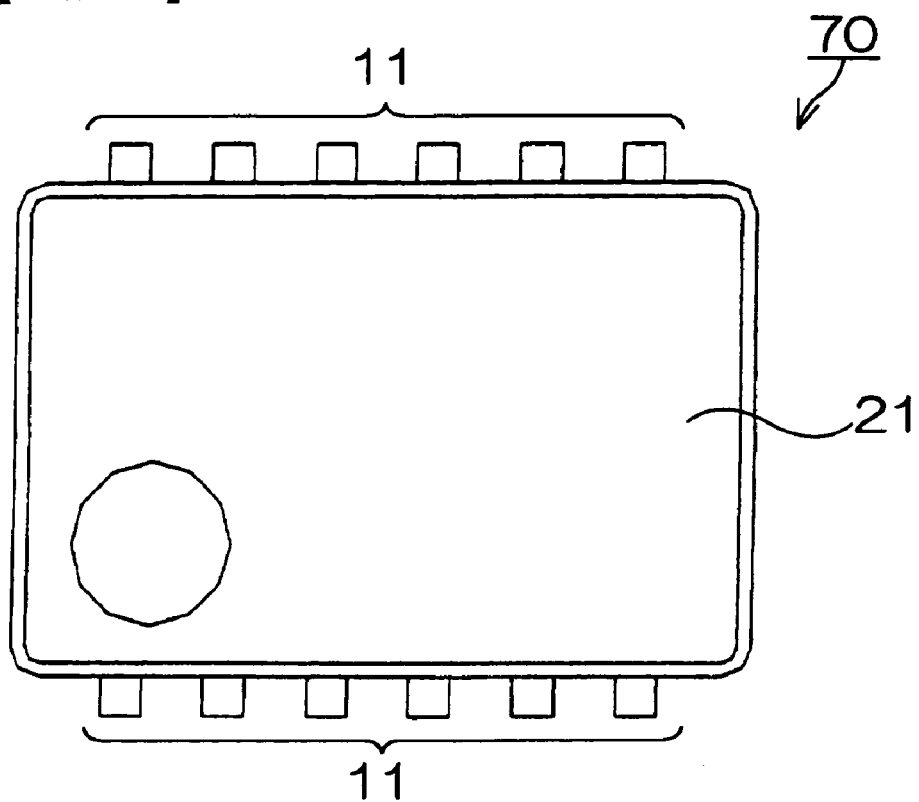

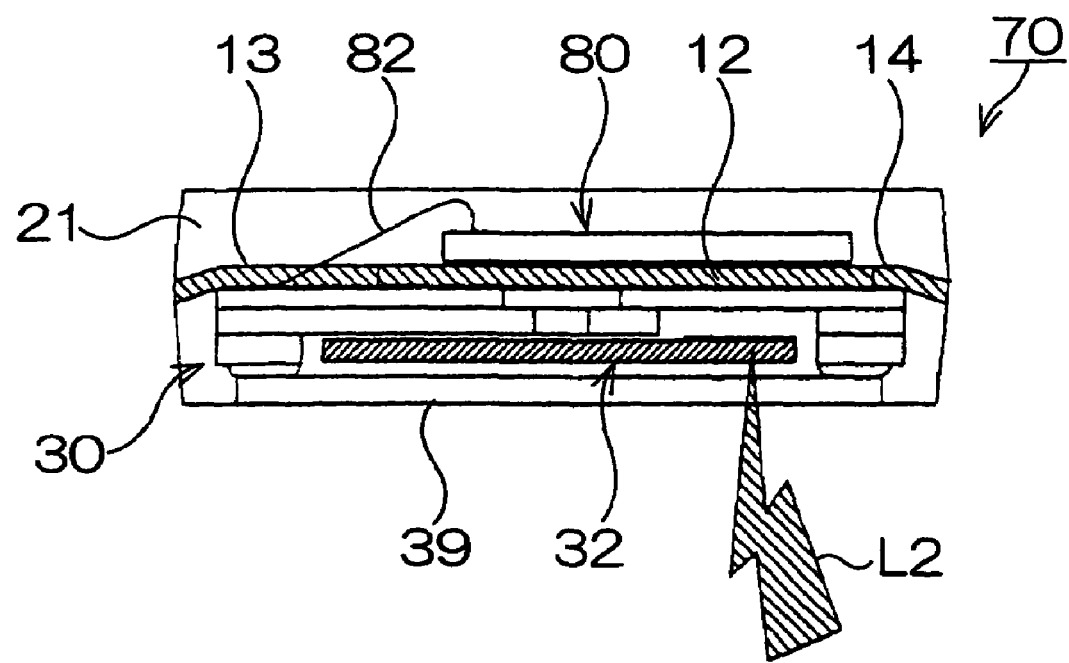
[FIG. 17]

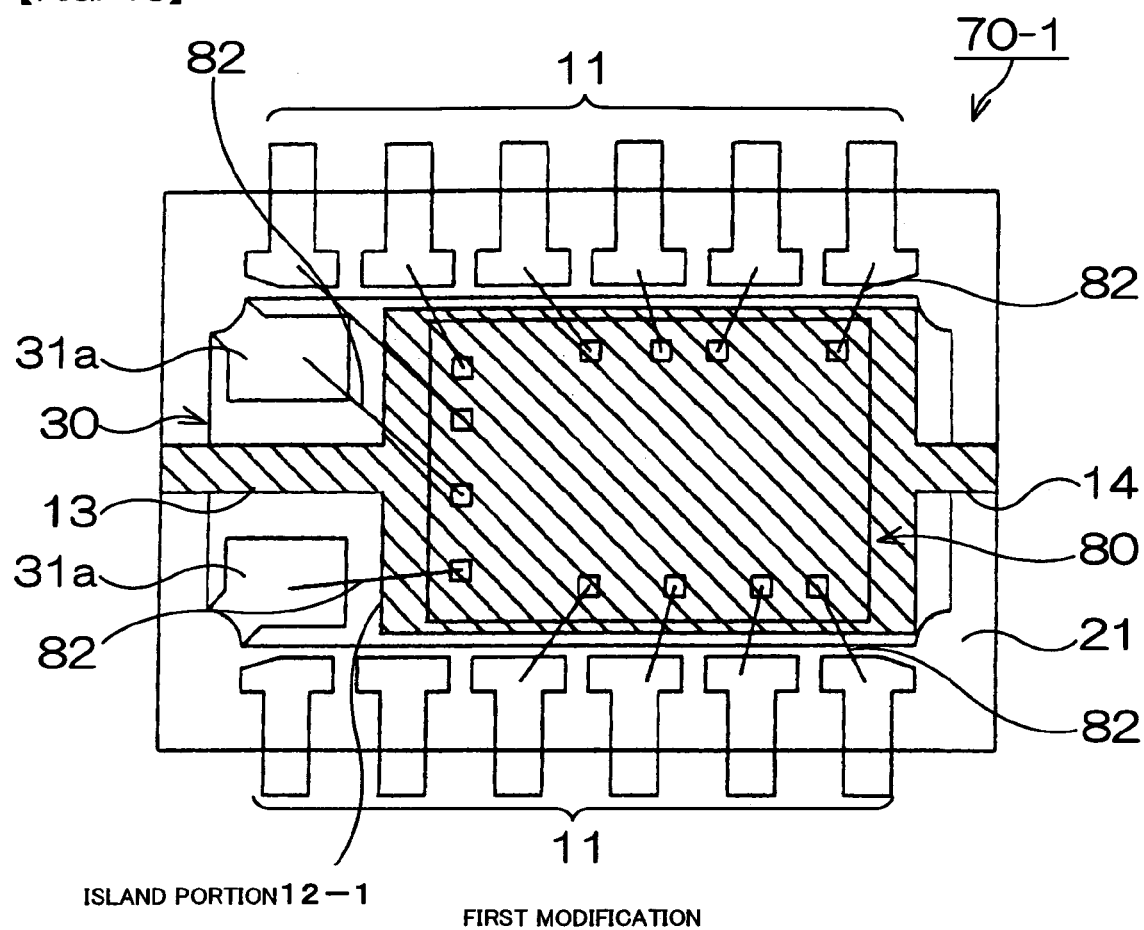
[FIG. 18] FIRST MODIFICATION

[FIG. 19]
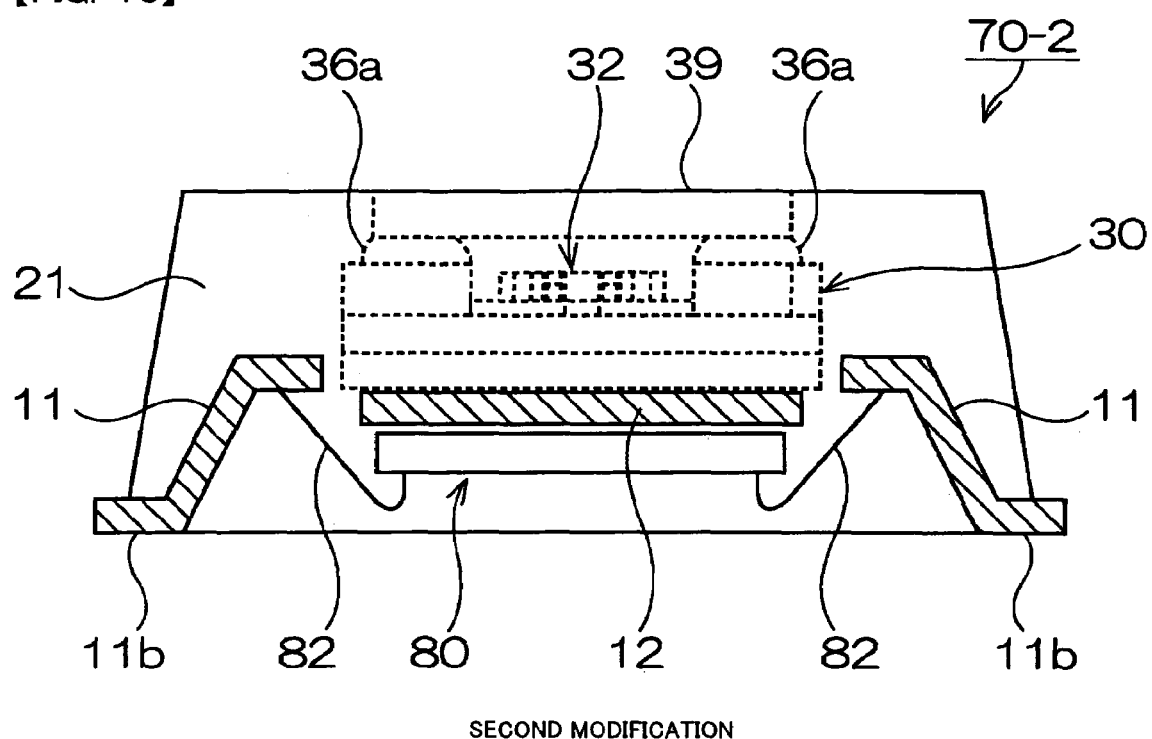
SECOND MODIFICATION

[FIG. 20]
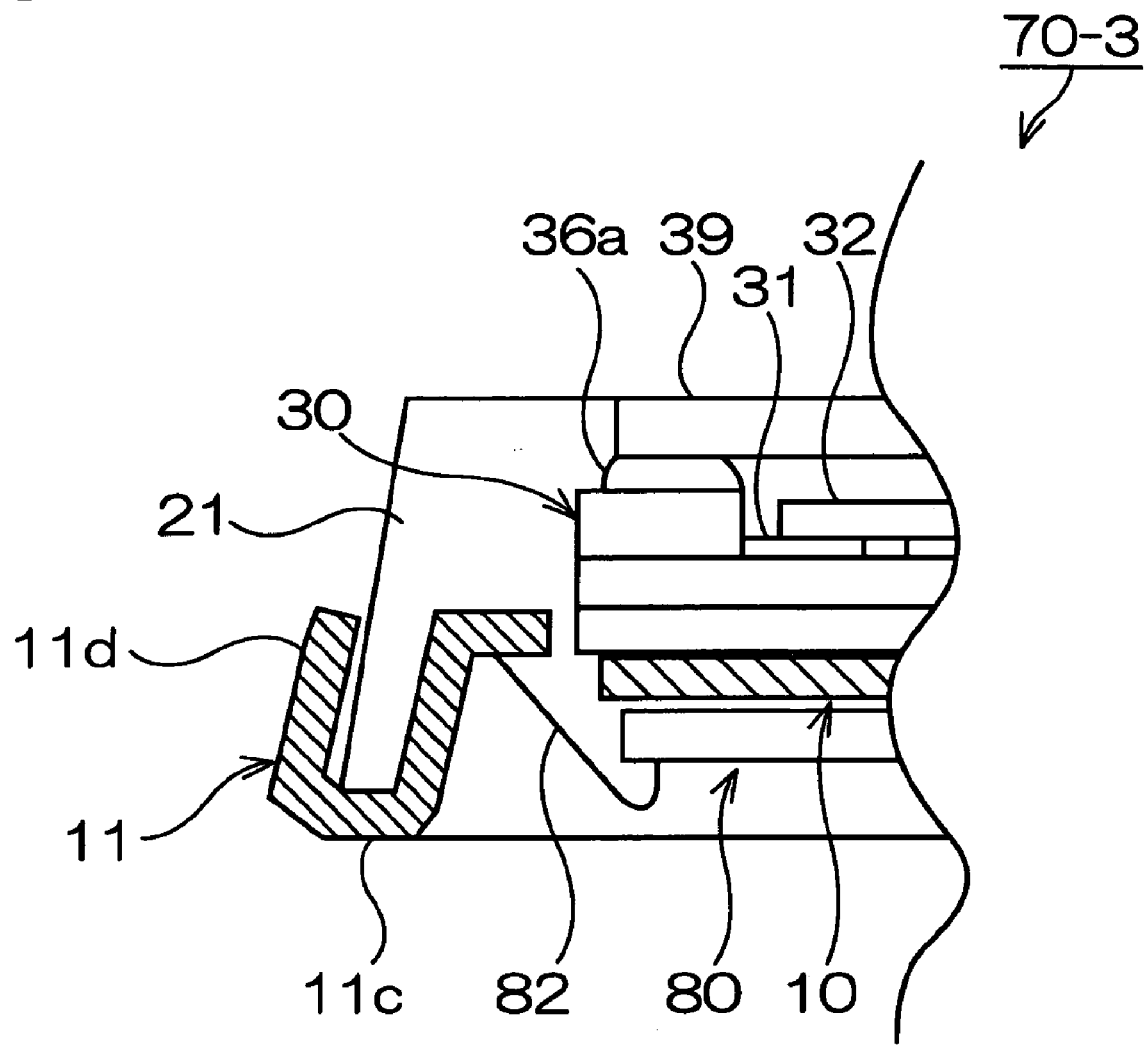
THIRD MODIFICATION

[FIG. 21]
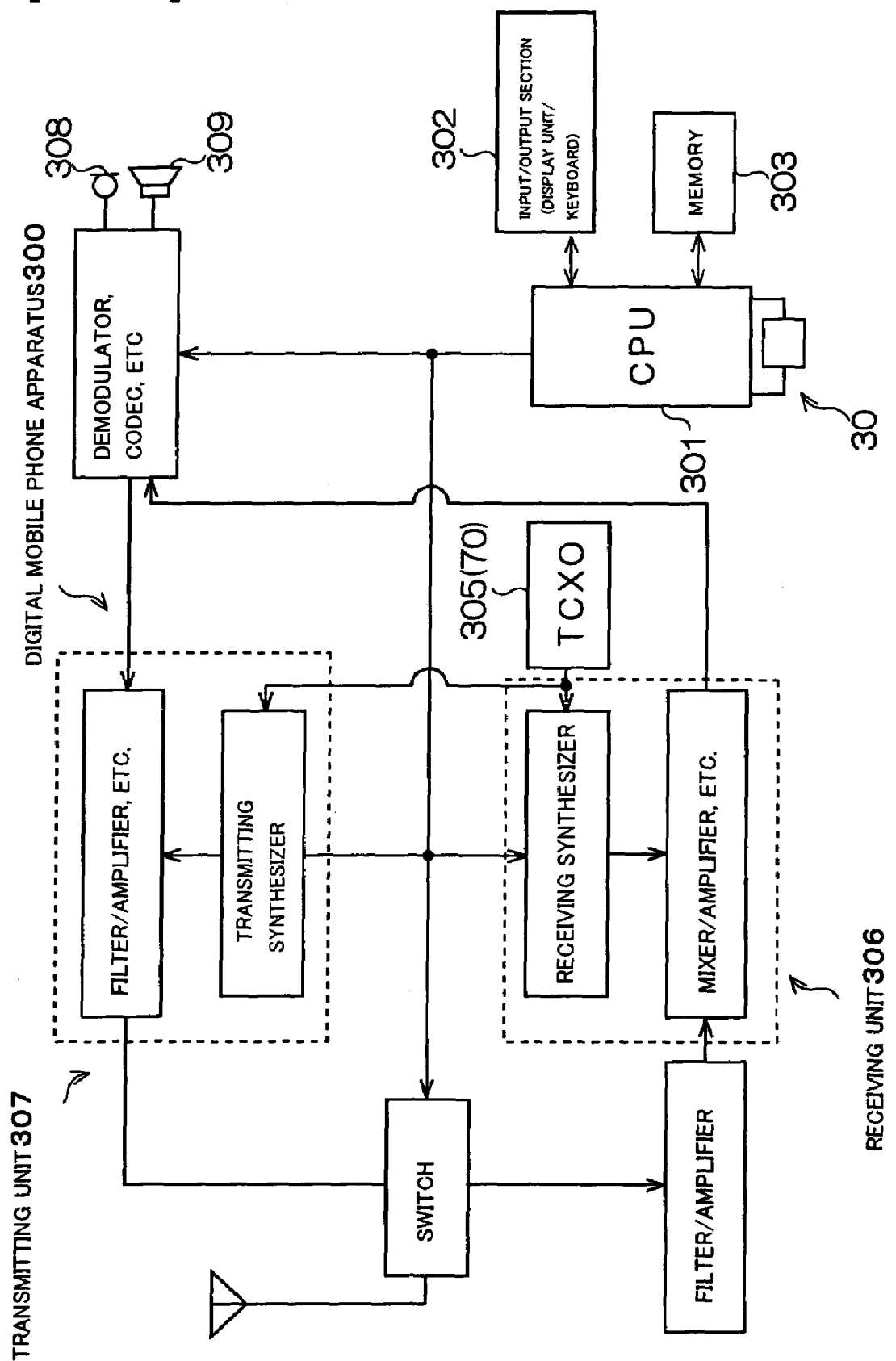

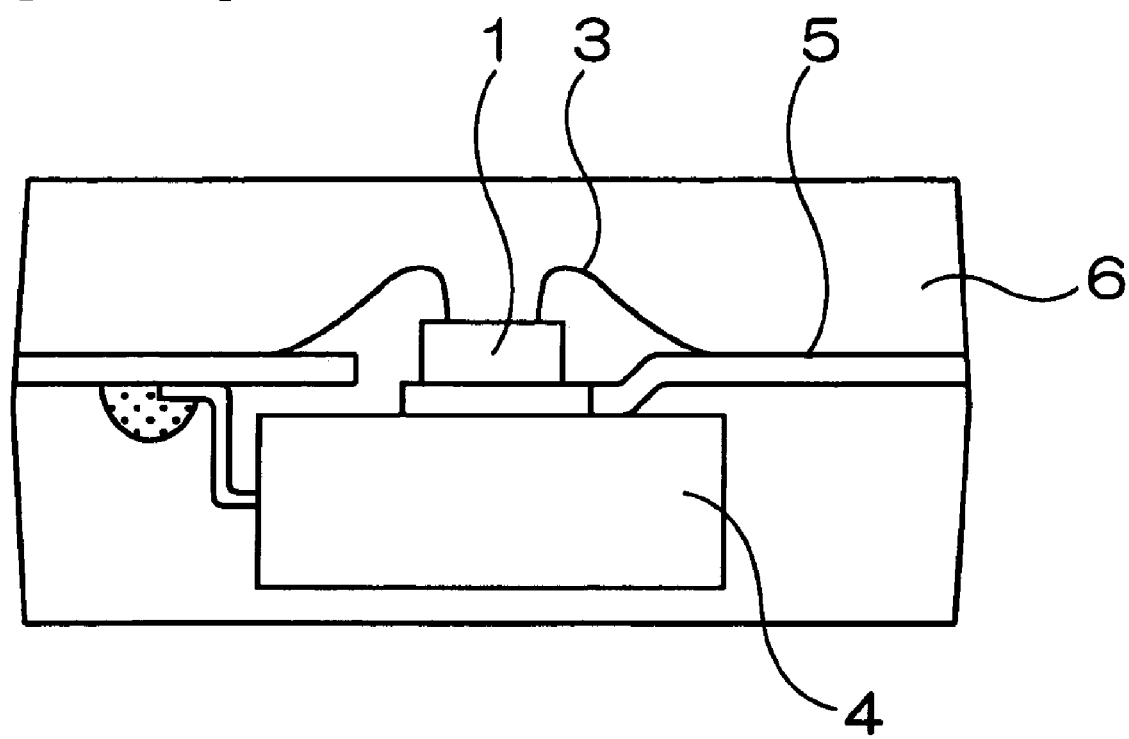
[FIG. 22]

PIEZOELECTRIC OSCILLATOR, MANUFACTURING METHOD THEREFOR, MOBILE PHONE APPARATUS USING PIEZOELECTRIC OSCILLATOR, AND ELECTRONIC APPARATUS USING PIEZOELECTRIC OSCILLATOR

BACKGROUND OF THE INVENTION

1. Field of Invention

The invention relates to a piezoelectric oscillator having a piezoelectric resonator package housing a piezoelectric resonator element and a semiconductor device including an oscillation circuit for oscillating the piezoelectric resonator element, a manufacturing method for the piezoelectric oscillator, and a mobile phone and an electronic apparatus using the piezoelectric oscillator.

2. Description of Related Art

Piezoelectric oscillators have been widely used in packages for HDDs (hard disk drives); mobile computers; or compact information apparatuses, such as IC cards; and mobile communication apparatuses, such as mobile phones, automobile phones, or paging systems. FIG. 22 shows an exemplary configuration of a conventional piezoelectric oscillator (see, for example, "Micro Film" in Japanese Unexamined Utility Model Registration Application Publication No. 1-82507). In the figure, the piezoelectric oscillator is configured as follows. A semiconductor device 1 is fixed to one surface of a lead frame 5 with an adhesive or the like and a piezoelectric resonator 4 housed in a cylindrical package is fixed to the other surface of the lead frame 5. The semiconductor device 1 and the external terminals of the lead frame 5 are connected via bonding wires 3. The entire structure is molded with a resin 6.

Such a structure can avoid various inconveniences when the piezoelectric resonator element and the oscillation circuit are housed in the same package. In other words, when the piezoelectric resonator element and the oscillation circuit are simultaneously housed in the resin package, a gas generated when the resin is cured may attach to the piezoelectric resonator element, thus leading a decline in performance. Accordingly, as described above, when the piezoelectric resonator element and the oscillation circuit are housed in the separate packages and are fixed to different surfaces of the lead frame, those inconveniences can be avoided and the configuration can be miniaturized.

Such a configuration is also disclosed in another patent document (see, for example, Japanese Unexamined Patent Application Publication No. 7-162236).

SUMMARY OF THE INVENTION

However, with the conventional piezoelectric oscillators, when a frequency displacement of the piezoelectric resonator becomes problematic after resin molding, no measure therefor has been taken. Specifically, in recent years, considerably high accuracy is required for the frequency performance of a piezoelectric oscillator. After the package of the piezoelectric resonator is sealed, when the frequency of the piezoelectric resonator changes to a problematic extent due to the influence of the subsequent manufacturing process or the like, it is impossible to ship the piezoelectric oscillator as a product. Further, the conventional piezoelectric oscillators have some problems. Specifically, the components are wasted, the manufacturing yield also decreases, and, consequently, the manufacturing cost increases.

An object of the invention is to provide a piezoelectric oscillator that allows for fine adjustment of the frequency after resin molding, a manufacturing method therefor, and a mobile phone and an electronic apparatus using the piezoelectric oscillator.

To achieve the foregoing object, a first aspect of the invention provides a piezoelectric oscillator. The piezoelectric resonator includes a resonator package, in which a piezoelectric resonator element is housed, and a semiconductor device, in which an oscillation circuit that is electrically connected to the resonator package is incorporated. The resonator package and the semiconductor device are fixed to corresponding different surfaces of an island portion of a lead frame. Resin molding is performed such that a transparent lid of the resonator package is exposed to the outside.

According to the configuration of the first aspect, resin molding is performed such that the transparent lid of the resonator package is exposed to the outside. Thus, even after assembly, the inside of the resonator package can be illuminated with external laser light for frequency adjustment through the transparent lid, which makes it possible to adjust the frequency of the piezoelectric resonator element in the resonator package. In other words, after the piezoelectric resonator package is sealed, when the influence of the manufacturing process or the like causes the frequency of the piezoelectric resonator to be changed to a problematic extent, for example, the electrodes of the piezoelectric resonator element can be partly vaporized with the laser light, so that the frequency can be adjusted by a mass reduction technique. Accordingly, the present invention can provide a piezoelectric oscillator that can perform fine adjustment of the frequency even after resin molding. Further, not only can the frequency be adjusted but also unwanted wires and the like within the package can be disconnected after products are manufactured.

According to a second aspect of the invention, in the configuration of the first aspect, the lead frame has the island portion and external terminal portions separated from the island portion. At least a portion of the lead frame can be deformed such that a region of the island portion, the region being connected to at least the semiconductor device, is positioned further away from the transparent lid than the external terminal portions.

According to the configuration of the second aspect, since at least a portion of the lead frame is deformed such that the island portion is positioned in a direction away from the transparent lid, the transparent lid of the resonator package is pressed in the molding dies in the direction in which the portion of the lead frame is deformed. Thus, since the lid is pressed by the inner surface of the molding die when molded so that they are in tight contact with each other, the resin does not enter the outer surface side of the lid, and thus no burr is generated between the inner surface of the die and the lid. Accordingly, the entire surface of the transparent lid can be appropriately exposed, without the need for removing burrs from the surface of the lid after the manufacture.

According to a third aspect of the invention, in the configuration of the second aspect, the island portion has holding lead portions that have a smaller width than the island portion and that extend outward, and the deformation is provided at the holding lead portions. According to the configuration of the third aspect, since the holding lead portions are formed to have a smaller width than the island portion, stress generated during the resin molding is readily concentrated at the holding lead portions. This allows the holding lead portions to be appropriately deformed while avoiding the deformation of the island portion associated with the fixing function of the lead frame with respect to the resonator package and the semiconductor device. Also, since stress generated from the deformation can be concentrated at the holding lead portions, it is possible to prevent the semiconductor device from being damaged.

According to a fourth aspect of the invention, in the configuration of the third aspect, portions of the holding lead portions have deformation portions for facilitating deformation. According to the configuration of the fourth embodiment, when portions of the holding lead portions further have deformation portions for facilitating deformation, stress generated during the molding process can be appropriately concentrated at the deformation portions. The deformation portions can be provided by, for example, reducing the width of appropriate positions of the holding lead portions relative to the other regions.

According to a fifth aspect of the present invention, in the configuration of the fourth aspect, the deformation portions are defined by slits that penetrate the island portion at opposite sides of the holding lead portions. According to the configuration of the fifth aspect, since the deformation portions are defined by slits that penetrate the island portion at opposite sides of the holding lead portions, there is no need to reduce the width of the holding lead portions. Further, it is possible to concentrate stress at the slit formation regions while maintaining the component holding function during the molding process, and is also possible to facilitate the deformation of the deformation portions.

According to a sixth aspect of the present invention, in the configuration of one of the first to fifth aspects, the resonator package is fixed with at least three protrusion surfaces abutting against the island portion. The protrusion surfaces slightly protrude. According to the configuration of the sixth aspect, even when stress that causes the lead frame to be partly deformed is applied to the resonator package during the molding process, the resonator package can easily be positioned horizontally with respect to the island portion, since the resonator package abuts against the island portion at at least three protrusion surfaces. This arrangement, therefore, can effectively prevent the resonator package from being molded in a declined state.

A seventh aspect of the invention can provide a manufacturing method for a piezoelectric oscillator. A lead frame is prepared which includes a supporting frame that integrally supports a plurality of outer ends of external terminal portions and outer ends of holding lead portions that extend from an island portion serving as a die pad. The method can include the steps of fixing a semiconductor device incorporating an oscillation circuit to one surface of the island portion, fixing a resonator package to another surface of the island portion, providing necessary wires by wire bonding, and performing resin molding on the semiconductor device and the resonator package such that a transparent lid of the resonator package is exposed.

According to the configuration of the seventh aspect, when the resin molding is performed while the semiconductor device and the resonator package are fixed to the island portion, the transparent lid of the resonator package can be exposed. With this arrangement, even after the molding, the inside can be illuminated with external laser light for frequency adjustment, through the transparent lid, so that the frequency of a piezoelectric resonator element provided in the resonator package can be adjusted. In other words, after the piezoelectric resonator package is sealed, when the influence of the manufacturing process or the like causes the frequency of the piezoelectric resonator to be changed to a problematic extent, for example, the electrodes of the piezoelectric resonator element can be partly vaporized with the laser light, so that the frequency can be adjusted by a mass reduction technique.

According to an eighth aspect of the invention, in the resin molding step in the configuration of the seventh aspect, the transparent lid is caused to abut against an inner surface of a first die for molding the transparent lid and the first die and a second die are combined with reference to the positions of the holding lead portions such that at least a portion of the lead frame is deformed to cause the transparent lid to be displaced inward in the dies. The first die has a depth that is smaller than the thickness of the resonator package.

According to the configuration of the eighth aspect, the depth of the first die is made smaller than the thickness of the resonator package. The transparent lid is arranged to abut against an inner surface of the first die, the first die and the second die are combined with reference to the positions of the holding lead portions, and the resin molding is performed. By doing so, the resonator package is displaced inward, i.e., toward the semiconductor device, so that at least a portion of the lead frame is deformed. In this process, the transparent lid of the resonator package is pressed in the molding dies in the direction in which the portion of the lead frame is deformed. Thus, since the lid is pressed by the inner surface of the first die so that they are in tight contact with each other, the resin does not enter the outer surface side of the lid and thus no burr is generated between the inner surface of the die and the lid. That is, the entire surface of the transparent lid can be appropriately exposed, without the need for removing burrs from the surface of the lid after the manufacture.

Furthermore, since stress generated during the resin molding process is concentrated so that a portion of the lead frame is deformed, it is possible to prevent the stress to be applied to the semiconductor device and to prevent the semiconductor device being damaged.

According to a ninth aspect of the present invention, in the configuration of one of the seventh and eighth aspects, after the resin molding step, the inside of the resonator package is illuminated with laser light for frequency adjustment through the transparent lid, which is exposed to the outside, thereby adjusting the frequency of a piezoelectric resonator element in the resonator package. According to the configuration of the ninth aspect, after the resin molding step, the inside of the resonator package is illuminated with laser light for frequency adjustment through the transparent lid, which is exposed to the outside, thereby adjusting the frequency of the piezoelectric resonator element in the resonator package. With this arrangement, after the final step in which head and pressure during the manufacturing process are involved, the frequency of the resonator element in the resonator package can be adjusted. In other words, the frequency can be adjusted at a final stage before the shipment of products. This arrangement, therefore, can eliminate defective products that result from a frequency variation after the manufacture, eliminate component wastes, and increase the manufacturing yield.

In a tenth aspect of the present invention, in the configuration of one of the seventh to ninth aspects, in the wire bonding step, resonator connection terminals of the semiconductor device and mounting terminals of the resonator package are electrically connected by the wire bonding, and other terminals of the semiconductor device and inner leads of the external terminal portions of the lead frame are electrically connected by the wire bonding. According to the configuration of the tenth aspect, with regard to the electrical connection between the resonator package and the semiconductor device, they are not interconnected via the lead frame but are connected by bonding wires. Thus, since they are coated by a molding resin in the molding step, there is an advantage in that stray capacitance between the terminals does not increase.

An eleventh aspect of the invention provides a mobile phone apparatus using a piezoelectric resonator for obtaining a control clock signal. The piezoelectric resonator includes a resonator package, in which a piezoelectric resonator element is housed, and a semiconductor device, in which an oscillation circuit that is electrically connected to the resonator package is incorporated. The resonator package and the semiconductor device are fixed to corresponding different surfaces of an island portion of a lead frame, and resin molding is performed so that a transparent lid of the resonator package is exposed to the outside.

To achieve the foregoing object, a twelfth aspect of the invention provides an electronic apparatus using a piezoelectric resonator for obtaining a control clock signal. The piezoelectric resonator can include a resonator package, in which a piezoelectric resonator element is housed, and a semiconductor device, in which an oscillation circuit that is electrically connected to the resonator package is incorporated. The resonator package and the semiconductor device can be fixed to corresponding different surfaces of an island portion of a lead frame, and resin molding is performed so that a transparent lid of the resonator package is exposed to the outside.

BRIEF DESCRIPTION OF THE DRAWINGS

The invention will be described with reference to the accompanying drawings, wherein like numerals reference like elements, and wherein:

FIG. 1 is a schematic sectional view showing an embodiment of a piezoelectric oscillator of the invention;

FIG. 2 is a schematic plan view of the piezoelectric oscillator shown in FIG. 1;

FIG. 3 is a schematic plan view of a resonator package used for the piezoelectric oscillator shown in FIG. 1;

FIG. 4 is a schematic sectional view taken along line B—B shown in FIG. 3;

FIG. 5 is a schematic sectional view taken along line C—C shown in FIG. 3;

FIG. 6 is a schematic cross sectional view of a structure in which the piezoelectric oscillator shown in FIG. 1 is modified;

FIG. 7 is a flow chart showing a brief overview of an example of a manufacturing process of the piezoelectric oscillator shown in FIG. 1;

FIG. 8 is a schematic plan view showing one example of a lead frame prepared in the manufacturing process shown in FIG. 7;

FIGS. 9(a) and 9(b) show a schematic view illustrating a part of the manufacturing process shown in FIG. 7, FIG. 9(a) being a schematic plan view and FIG. 9(b) being a schematic bottom view;

FIG. 10 is a schematic plan view illustrating a part of the manufacturing process shown in FIG. 7;

FIG. 11 is a schematic plan view illustrating a part of the manufacturing process shown in FIG. 7;

FIG. 12 is a schematic sectional view showing a state before the dies are clamped in the process shown in FIG. 11;

FIG. 13 is a schematic plan view illustrating a part of the manufacturing process shown in FIG. 7;

FIG. 14 is a schematic sectional view showing a state after the dies are clamped in the process shown in FIG. 13;

FIG. 15 is a schematic plan view illustrating a part of the manufacturing process shown in FIG. 7;

FIG. 16 is a schematic plan view illustrating the completed form of the piezoelectric oscillator shown in FIG. 1;

FIG. 17 is a schematic sectional view illustrating a frequency adjustment process in the manufacturing process shown in FIG. 7;

FIG. 18 is a schematic plan view illustrating a first modification of the piezoelectric oscillator shown in FIG. 1;

FIG. 19 is a schematic sectional view illustrating a second modification of the piezoelectric oscillator shown in FIG. 1;

FIG. 20 is a schematic cross sectional view showing a third modification of the piezoelectric oscillator shown in FIG. 1;

FIG. 21 is a diagram showing a schematic configuration of a digital mobile phone apparatus, which is one example of an electronic apparatus using the piezoelectric oscillator according to the embodiment of the invention; and FIG. 22 is a schematic sectional view showing an example of a conventional piezoelectric oscillator.

DETAILED DESCRIPTION OF PREFERRED EMBODIMENTS

FIGS. 1 and 2 show an embodiment of a piezoelectric oscillator of the invention, FIG. 1 being a schematic sectional view thereof and FIG. 2 being a schematic plan view thereof. FIGS. 1 and 2 show the internal structure of a resin mold portion in a transparent manner for convenience of understanding.

In the figures, a piezoelectric oscillator 70 has a resonator package 30, in which a piezoelectric resonator element is housed, and an IC chip 80, which is a semiconductor device in which an oscillation circuit that is electrically connected to the resonator package 30 is incorporated.

More specifically, the piezoelectric oscillator 70 can be constructed as follows. The IC chip 80 is fixed to one surface (the upper surface in FIG. 1) of a lead frame 10 and the resonator package 30 is fixed to the other surface (the lower surface in FIG. 1) of the lead frame 10. The resulting structure is molded with a resin 21 such that only a lid 39 of the resonator package 30 is exposed.

The resonator package 30 incorporated in the piezoelectric oscillator 70 of the embodiment will first be described with reference to FIGS. 3 to 5.

The resonator package 30 can be used singly as a piezoelectric device, and in the embodiment, FIGS. 3 and 4 particularly show an example in which the resonator package 30 is configured with a quartz crystal resonator. The resonator package 30 has a housing container (a ceramic container) 36 in which a piezoelectric resonator element 32 is housed. The housing container 36 is formed by depositing a plurality of substrates, each being formed by shaping a ceramic green sheet containing aluminum oxide as insulating material, and then sintering the substrates. Each substrate has a predetermined hole therein, so that, when stacked, the substrates have a predetermined internal space S2 therein.

The internal space S2 can serve as a housing space for housing the piezoelectric resonator element 32. In other words, as shown in FIG. 4, in the embodiment, the housing container 36 is formed by stacking a first multilayer substrate 61, a second multilayer substrate 64, and a third multilayer substrate 68 from below. In the figure, in the vicinities of left end portions in the internal space S2 of the housing container 36, the second multilayer substrate 64 that is exposed to the internal space S2 and that defines the internal bottom portion has electrode portions 31, which is formed by, for example, plating a tungsten metallized member with nickel and gold.

The electrode portions 31 provide external connections and supply drive voltages. Conductive adhesives 43 are applied to the electrode portions 31, a base 51 of the piezoelectric resonator element 32 is placed on the conductive adhesives 43, and the conductive adhesives 43 are cured. As the conductive adhesives 43, an adhesive that is made by containing conductive particles, such as silver fine particles, in a synthetic resin that serves as an adhesive component having a bonding capability can be used. Alternatively, a silicone, epoxy, polyimide conductive adhesive, or the like can be used.

The piezoelectric resonator element 32 can be formed by etching a piezoelectric material, for example, quartz crystal. In this embodiment, the piezoelectric resonator element 32 is formed to have a small size and has a shape particularly shown in FIG. 3 to provide necessary performance. In other words, the piezoelectric resonator element 32 has the base 51, which is fixed to the housing container 36 side, and a pair of resonating arms 34 and 35, which bifurcate from the base 51 and extend parallel to each other toward the right side in the figure. Thus, a so-called turning-fork type resonator element, which has the overall shape of a turning fork, is used for the piezoelectric resonator element 32.

The resonating arms 34 and 35 of the piezoelectric resonator element 32 have corresponding elongated grooves 56 and 57, which have bottoms and which extend in the longitudinal direction. As shown in FIG. 5, which is a cross-sectional view taken along line C—C shown in FIG. 3, the grooves 56 and 57 are provided in both upper and lower surfaces of the corresponding resonating arms 34 and 35.

Referring to FIG. 3, extraction electrodes 52 and 53 are provided in the vicinities of two opposite ends in the lateral direction at an end portion (the left end portion in FIG. 3) of the base 51 of the piezoelectric resonator element 32. Similarly, the extraction electrodes 52 and 53 are formed on the reverse surface, not shown, of the base 51 of the piezoelectric resonator element 32.

The extraction electrodes 52 and 53 are portions that are connected to the electrode portions 31 adjacent to the housing container 36 shown in FIG. 3 with the conductive adhesives 43, as described above. The electrode portions 31 adjacent to the housing container 36 are connected to corresponding mounting terminals 31a provided on an outer surface of the left end portion of the first multilayer substrate 61. In practice, the mounting terminals 31a can be provided at two opposite ends in the lateral direction of the resonator package 30. Further, dummy electrodes 31b can be provided on an outer surface of the right end portion of the first multilayer substrate 61. The dummy electrodes 31b are not connected to the piezoelectric resonator element 32, and have the same shape as the mounting terminals 31a. The dummy electrodes 31b are provided at two opposite ends in the lateral direction at the right end portion of the first multilayer substrate 61.

The extraction electrodes 52 and 53 of the piezoelectric resonator element 32 can be connected to corresponding excitation electrodes 54 and 55 (not shown) provided in the grooves 56 and 57 of the resonating arms 34 and 35. As shown in FIG. 5, the excitation electrodes 54 and 55 are also formed at two opposite side surfaces of the corresponding resonating arms 34 and 35. For example, with regard to the resonating arm 34, the excitation electrodes 54 in the grooves 57 and the excitation electrodes 55 on its side surface portions are adapted to have opposite polarities to each other. With regard to the resonating arm 35, the excitation electrodes 55 in the grooves 56 and the excitation electrodes 54 on its side surface portions are adapted to have opposite polarities to each other As shown in FIG. 4, in the vicinity of substantially the center of the bottom surface of the housing container 36, interconnected through-holes 37a and 37b are formed in two multilayer substrates 61 and 64 included in the housing container 36, so that a through-hole 37 that is open to the outside is provided. Of the two through-holes constituting the through-holes 37, the outer through-hole 37a, which is a second hole located outside, has a larger inner diameter than the first hole 37b, which opens to the inside of the resonator package 30. Thus, the through-hole 37 is shaped to have a stepped opening with a downward step portion 62 in FIG. 4. A metal coating portion is preferably provided on the surface of the step portion 62.

The through-hole 37 is filled with a metal sealant 38, which is preferably selected from, for example, lead-free sealants, and is selected from, for example, a silver brazing material, Au/Sn alloy, and Au/Ge alloy. Correspondingly, the metal coating portion on the surface of the step portion 62 is preferably formed by plating a tungsten metallized member with nickel and gold.

The lid 39 is joined to the open upper end of the housing container 36 with a brazing material 36a, such as a low-melting-point glass, to seal the housing container 36. The lid 39 is formed of a light transparent material, particularly, thin-plate glass, so that metal coating portions (described below) of the piezoelectric resonator element 32 is illuminated with external laser light L2, as described below, to allow the frequency to be changed by a mass reduction technique.

A suitable material for making the lid 39 transparent is generally glass. As such glass material, a thin-plate glass, e.g., borosilicate glass, manufactured by down drawing is used.

With this structure, as shown in FIG. 4, the mounting terminals 31a, the dummy terminals 31b, and the metal sealant 38 provide protrusion portions that slightly protrude at the bottom surface of the first substrate 61 to such a degree corresponding to the thickness of the electrodes. The amounts of protrusions of the mounting terminals 31a, the dummy terminals 31b, and the metal sealant 38 are substantially equal.

Further, referring to FIG. 4, a depression 42 is provided by removing a portion inside the second substrate 64. Consequently, in a case in which the resonator package 30 is externally shocked, even when the tips of the piezoelectric resonator element 32 are displaced in the arrow D direction, the tips of the piezoelectric resonator element 32 hit the inner bottom portion of the housing container 36, thereby effectively preventing the piezoelectric resonator element 32 from being damaged.

Constricted portions or notches 44 and 45, which are inwardly notched at two opposite edges in the lateral direction, can preferably be formed in the vicinities of base portions of the resonating arms 34 and 35 at the base 51 of the piezoelectric resonator element 32. This can effectively prevent the flexural vibrations of the resonating arms 34 and 35 from leaking toward the base 51.

Next, referring to FIG. 1, the IC chip 80, which is a semiconductor device, houses an oscillation circuit formed of an integrated circuit, which is not shown. The IC chip 80 is fixed to one surface of an island portion, described below, of the lead frame 10 by using, for example, an epoxy or silicon adhesive 80a.

As shown in FIG. 2, one surface of the IC chip 80, the surface being opposite to the surface joined to the lead frame 10, can be provided with a plurality of terminal portions. These terminal portions are connected to corresponding inner leads of external terminal portions 11 (described below) of the lead frame 10 by wire bonding. Naturally, the number of terminal portions of the IC chip 80 may be larger or smaller than the number of terminal portions shown in FIG. 2, depending on the type of the IC chip.

Referring to FIG. 2, the terminal portions 11 of the IC chip 80 in the embodiment are called, for example, gate/drain (G/D) terminals, and serve as terminals for connection with the resonator package 30. The terminal portions 81 are connected using bonding wires 82 to the above-described mounting terminals 31a of the resonator package 30. Thus, with regard to the electrical connection between the resonator package 30 and the IC chip 80, they are not interconnected via the lead frame 10. This offers an advantage in that stray capacitance does not increase between the terminals. Since individual configurations of other terminal portions of the IC chip 80 are different from each other depending on the type of the IC chip 80, the descriptions thereof are omitted.

The piezoelectric oscillator 70 of the embodiment is configured as described below, and is molded with the resin in a manufacturing process described above such that the transparent lid 39 of the resonator package 30 is exposed to the outside, as shown in FIG. 1. Thus, after assembly, the inside of the piezoelectric oscillator 70 can be illuminated with external laser light L2 for frequency adjustment through the transparent lid 39, by the same method as that described with reference to FIG. 4. As a result, after manufacture of the piezoelectric oscillator 70, particularly, after resin molding, the frequency of the piezoelectric resonator element 32 within the resonator package 30 can be adjusted.

That is, after the lid 39 of the resonator package 30 is sealed, when the influence of the manufacturing process, such as resin molding, causes the frequency of the piezoelectric resonator element 32 to be changed to a problematic extent, for example, the electrodes of the piezoelectric resonator element 32 can be partly vaporized with the laser light L2 by a mass reduction technique, so that the frequency can be adjusted.

Additionally, not only can the frequency be adjusted, but also unwanted wires and the like within the package can be disconnected after products are manufactured.

In the above-described embodiment, the resonator package 30 can be arranged at the lower side (the mounting substrate side) and the IC chip 80 is arranged at the upper side so as to sandwich the lead frame 10 therebetween. Alternatively, as shown in FIG. 6, the arrangement may be such that the resonator package 30 is arranged at the upper side and the IC chip 80 is arranged at the lower side (the mounting substrate side) so as to sandwich the lead frame 10, so that the lid 39 is exposed upward. In this case, the external terminal portions 11 are formed to have a so-called J-lead shape in which terminals 11a are bent downward (toward the mounting substrate) so as to go around the resin 21.

FIG. 7 is a flow chart for a preferred embodiment of an exemplary manufacturing method for the piezoelectric oscillator 70 of the embodiment. FIG. 8 is a schematic plan view showing the configuration of a lead frame prepared for the manufacture of the piezoelectric oscillator 70.

Before describing a manufacturing method for the piezoelectric oscillator 70, the structure of a lead frame will first be described with reference to FIG. 8. Referring to FIG. 8, for the lead frame 10, one that is commonly used for manufacturing a package device can be used. Examples include a lead frame formed of an Fe alloy, such as a 42 alloy; a Cu metal, such as Cu—Sn, Cu—Fe, Cu—Zn, or Cu—Ni; or ternary alloy containing a third element added to those alloys.

The lead frame 10 has an outer frame portion 17, an island portion 12, and the external terminal portions 11. The island portion 12 is provided inside the outer frame portion 17 and in the vicinity of substantially the center thereof to serve as a die pad. The external terminal portions 11 are arranged to be parallel to each other at two opposite sides of the island portion 12 in the lateral direction to serve as lead portions. Further, the external terminal portions 11 are separated from the island portion 12 and are supported by the outer frame portion 17. The number of external terminal portions 11 is determined so as to correspond to, for example, the number of terminals of the IC chip 80 which are connected to the external terminal portions 11.

The island portion 12 serves as a die pad for mounting a device and has an area and a width which are suitable for the purpose. The island portion 12 has holding lead portions 13 and 14 that integrally extend from two opposite edges of the island portion 12. The holding lead portions 13 and 14 have a width that is smaller than the width of the island portion 12, extend toward the outer frame portion 17, and are integrated with the outer frame portion 17. Thus, the island portion 12 has a structure in which it is supported with respect to the outer frame portion 17 of the lead frame 10 by the narrow holding lead portions 13 and 14.

Preferably, the island portion 12 is formed to have slits 15 and slits 16, which are formed so as to penetrate the island portion 12 at two opposite sides in the lateral direction of the holding lead portions 13 and 14, as shown in FIG. 8. That is, the slits 15 and the slits 16 are provided as one variation of a deformation portion for facilitating the deformation of the holding lead portions 13 and 14 in a manufacturing process described below. Thus, instead of the slits described above, the deformation portions may be notch portions that are formed by notching a larger area of the island portion 12. Alternatively, predetermined portions of the holding lead portions 13 and 14 may be set to have a smaller width than the other regions. In any case, the deformation portions can be provided by forming structurally weak portions at the holding lead portions 13 and 14 or the portion where the holding lead portions 13 and 14 and the island portion 12 are integrated with each other so that stress generated in a molding process described below is concentrated at that portion.

Alternatively, the island portion 12 may be provided with a deformation portion by forming the island portion 12 such it has an irregular shape itself, to allow a portion of the island portion 12 to be deformed.

An embodiment of a manufacturing method for the piezoelectric oscillator 70 will now be described. As shown in step ST1 of FIG. 7, the IC chip 80 is bonded as shown in FIG. 9(a) using the lead frame 10 illustrated in FIG. 8. In other words, one surface of the IC chip 80, the one surface being not the surface having the terminals of the IC chip 80, is bonded to the island portion 12 of the lead frame 10 using the adhesive illustrated in FIG. 1.

FIG. 9(b) shows a surface opposite to the surface shown in FIG. 9(a). Next, as shown in FIG. 9(b), the resonator package 30 is bonded to the island portion 12 using, for example, an epoxy or silicon adhesive (step ST2). The adhesive is indicated by reference numeral 30a in FIG. 1. In this case, as shown in FIG. 9(a), the mounting terminals 31a of the resonator package 30 are bonded and fixed so as to be exposed from the island portion 12.

In this case, since the bottom surface of the resonator package 30 is bonded to the island portion 12, as illustrated in FIG. 4, the dummy terminals 31b, which are arranged at two opposite end portions in the lateral direction at the end portions in the lateral direction of the resonator package 30, and the metal sealant 38, which is provided in the vicinity of the center of the resonator package 30, abut against the bottom surface of the resonator package 30 (see FIG. 9(b)).

Since the dummy terminals 31b and the metal sealant 38 provide protrusion portions that slightly protrude to the same extent from the bottom surface, the resonator package 30 abuts against the island portion 12 at the three points. Thus, the resonator package 30 is fixed without inclination relative to the island portion 12.

Next, as shown in FIG. 10, the individual terminals of the IC chip 80 and the corresponding inner leads of the external terminal portions 11 are connected by wire bonding (step ST3 in FIG. 7). In particular, as illustrated in FIG. 2, the gate/drain (G/D) terminals, which are the terminal portions 81 of the IC chip 80, are connected to the above-described mounting terminals 31a, which are exposed from the island portion 12 of the resonator package 30, by using the bonding wires 82, such as gold (Au) lines. The bonding wires 82 are covered with a resin mold described below, so that the terminal portions 81 of the IC chip 80 and their conductive portions are not exposed to the outside. This can prevent moisture in the air from attaching to those portions and thus can prevent short-circuiting.

As described above, electrical connections can be provided between the lead frame 10 and the IC chip 80 and between the IC chip 80 and the resonator package 30.

Next, as shown in FIGS. 11 to 14, resin molding is performed (step ST4 in FIG. 7).

For this molding, first and second molding dies 18 and 19 are used as shown in FIGS. 11 and 12. The first die 18 is shown at the lower side in FIGS. 12 and 14 and the second die 19 is shown at the upper side in FIGS. 12 and 14.

In this process, the first die 18 and/or the second die 19 are moved relative to each other in the arrow directions as shown in FIG. 12, so that the periphery of the island portion 12 of the lead frame 10 is sandwiched between the dies 18 and 19. The resonator package 30 and the IC chip 80, which is fixed to the island portion 12, are housed in the dies and molten resin is injected into the combined dies through a gate, which is not shown, so that a mold is provided by transfer molding. In this case, for example, an epoxy resin can be used for the molding resin.

In this case, as shown in FIG. 14, the first die 18 located below is set to have a depth D that is smaller than a thickness h including the lid 39 of the resonator package 30. As shown in FIG. 14, the resonator package 30 and the IC chip 80, which is fixed to the island portion 12, are housed between the first die 18 and the second die 19 and are sandwiched therebetween with reference to the positions of the holding lead portions 13 and 14. That is, they are sandwiched such that the seam of the first die 18 and the second die 19 are set at the positions of the holding lead portions 13 and 14. The resonator package 30 is arranged such that the lid 39 abuts against an inner surface of the first die 18 in the dies. Furthermore, since the depth D of the first die 18 is designed to be smaller than the thickness h including the lid 39 of the resonator package 30, the outer surface of the lid 39 is pressed strongly against the inner surface of the first die 18 and the holding lead portions 13 and 14 are deformed as shown. That is, the holding lead portions 13 and 14 adjacent to the island portion 12 are deformed upward.

After the deformation, at least, a plane in which the external terminal portions 11 that have the plurality of leads, which constitute the external terminals, are located, and a plane in which the island portion 12 exists are at different positions from each other.

In this case, stress generated during the above-described molding work is not applied to the IC chip 80 but is concentrated at the holding lead portions 13 and 14, thereby preventing the IC chip 80 from being damaged.

Furthermore, the resonator package 30 is deformed upward in the figure, and the outer surface of the lid 39 is strongly pressed against the inner surface of the first die 18. Thus, in this state, molten resin is injected into the dies, so that the molten resin surrounds the IC chip 80, which is fixed to the island portion 12, and the resonator package 30, except for the outer surface of the lid 39. As a result, this arrangement prevents the resin from entering between the outer surface of the lid 39 and the inner surface of the first die 18. This arrangement also prevents the resin from becoming burrs and attaching to the outer surface of the lid 39 after the molding.

Next, in the state the dies are clamped, as shown in FIG. 13, connections with the outer frame portion 17 are disconnected except for the holding lead portions 13 and 14. That is, the outer edge portions of the external terminal portions 11 are cut (step ST4 in FIG. 7).

Subsequently, portions exposed from the cut external terminal portions 11 are subjected to terminal plating (step ST5 in FIG. 7). As can be seen from FIGS. 15 and 16, the outer edge portions of the external terminal portions 11 are bent toward the lid 39 using a predetermined jig to have the so-called J-lead shape (step ST6 in FIG. 7).

As shown in FIG. 17, after the formation of the piezoelectric oscillator 70, that is, after the resin molding, the electrode portions of the piezoelectric resonator element 32 and so on are illuminated with external laser light L2 through the transparent lid 39 that is exposed to the outside. As a result, the metal coating portions of the electrode portions and the like can be partly vaporized, so that the frequency can be adjusted to be higher by a mass reduction technique (step ST7 in FIG. 7). Thus, in any of the manufacturing processes described above, for example, in the process involving heat, such as the molding process, even when the frequency of the resonator package 30 is changed, a final frequency adjustment can be performed. Thus, it is possible to eliminate defective products that result from such a frequency displacement. As a result, component wastes can be eliminated and the manufacturing yield is increased.

Lastly, the structure is subjected to necessary inspection (step ST8 in FIG. 7) to thereby provide the completed piezoelectric oscillator 70.

FIG. 18 is a schematic plan view showing a first modification of the embodiment of the piezoelectric oscillation according to the invention. Portions denoted with the same reference numerals as those used in the description of the piezoelectric oscillator 70 have common structures, and thus the duplicated descriptions are omitted. Now, differences will be mainly described. A piezoelectric oscillator 70-1 of the first modification is different in the structure of the island portion from the above-described piezoelectric oscillator 70.

That is, an island portion 12-1 does not have the slits 15 but has a substantially rectangular plate shape. With this configuration, similarly, in the molding process in step ST4 described above, stress generated when the dies are clamped is concentrated at the holding lead portions 13 and 14 that have a width smaller than the width of the island portion 12-1. Thus, the holding lead portions 13 and 14 serve as deformation portions to prevent an event in which undue stress applied to the IC chip 80 and so on causes damage.

Additionally, in the first modification, the shape of the island portion 12-1 is simple, which facilitates the manufacture and also improves the strength correspondingly.

FIGS. 19 and 20 show other modifications of the embodiment of the piezoelectric oscillator of the invention. Specifically, FIG. 19 is a schematic sectional view in the lateral direction of a piezoelectric oscillator 70-2 according to a second modification and FIG. 20 is a schematic sectional view in the lateral direction of a piezoelectric oscillator 70-3 according to a third embodiment. FIG. 20 illustrates only the left side since the right and left sections thereof are substantially symmetrical.

Hereinafter, since portions denoted with the same reference numerals as those used in the descriptions of the piezoelectric oscillator 70 have common structures, differences will be mainly described without redundant descriptions.

The piezoelectric oscillator 70-2 of the second modification and the piezoelectric oscillator 70-3 of the third modification are different from each other in the bending direction and the bending form of the external terminal portions 11. In other words, as can be seen from the comparison with FIG. 6 or 15, in the piezoelectric oscillator 70-2 shown in FIG. 19, the vicinities of the base portions of the external terminal portions 11 are bent in an opposite direction to that in the piezoelectric oscillator 70, i.e., are bent toward the IC chip 80, and tip portions 11*b* are bent in the horizontal direction.

In the piezoelectric oscillator 70-3 shown in FIG. 20, the vicinities of the base portions of the external terminal portions 11 are bent toward the mounting substrate, not shown, (i.e., toward the lower side in FIG. 20) and center portions vicinities 11*c* are bent in the horizontal direction and are exposed to the outside. Further, tip portions 11*d* of the external terminal portions 11 are bent toward the resonator package 30 (i.e., toward the upper side in FIG. 20) and are exposed to the outside so as to lie along side surfaces of the resin 21.

As described above, while providing the same advantages as that of the embodiment, the piezoelectric oscillators 70-2 and 70-3 of the modifications of the invention can be configured to have different forms of external terminals so as to correspond to, for example, mounting conditions for the substrate.

FIG. 21 is a diagram showing a schematic configuration of a digital mobile phone apparatus, which is one example of an electronic apparatus using the piezoelectric oscillator according to the embodiment of the invention.

In the figure, a sender's voice is converted by a microphone 308 into an electrical signal, which is then modulated by a demodulator/codec unit into a digital signal. The digital signal is converted by a transmitting unit 307 so as to have an RF (radio frequency) band and the resulting RF signal is transmitted to a base station (not shown) via an antenna. The frequency of an RF signal transmitted from a base station is converted by a receiving unit 306. The resulting signal is converted by the demodulator/codec unit into an audio signal, which is then output from a speaker 309. A CPU (central processing unit) 301 controls the entire operation of the digital mobile phone apparatus 300, including an input/output section 302 constituted by a liquid crystal display device and a keyboard. A memory 303 is information storing device, which is implemented by RAM, ROM, and the like, and is controlled by the CPU 301. The memory 303 stores, for example, telephone-book information and a control program for the digital mobile phone apparatus 300.

The piezoelectric oscillator according to the embodiment of the invention can be applied to, for example, a TCXO (Temperature Compensated X'tal Oscillator) 305. This TCXO 305 is a piezoelectric oscillator having a small frequency fluctuation with respect to a change in ambient temperature, and is widely applied to mobile phone apparatuses as a frequency reference source for the receiving unit 306 and the transmitting unit 307 shown in FIG. 21. In conjunction with recent miniaturization of mobile phone apparatuses, demands for miniaturized TCXOs are increasing. Thus, the TCXO 305 having the structure according to the embodiment of the present invention is very useful for the miniaturization.

In this manner, when the piezoelectric oscillator 70 according to the above-described embodiment is used for an electronic apparatus, such as the digital mobile phone apparatus 300, fine adjustment of the frequency can be achieved even after the resin molding. This arrangement, therefore, can improve the manufacturing yield and can reduce the manufacturing cost. Thus, the arrangement can also reduce the manufacturing cost of electronic apparatuses, such as the digital mobile phone apparatus 300.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A piezoelectric oscillator, comprising:
   a resonator package having a transparent lid, a piezoelectric container formed of a plurality of insulating substrates, and a mounting terminal, in which a piezoelectric resonator element is housed; and
   a semiconductor device in which an oscillation circuit that is electrically coupled to the resonator package is incorporated,
   the resonator package and the semiconductor device being fixed to corresponding different surfaces of an island portion of a lead frame, a terminal portion of the semiconductor device being connected to the mounting terminal of the resonator package by bonding wire, and resin molding being performed such that a transparent lid of the resonator package is exposed to an outside and each of the semiconductor device and resonator package are contained within a same body of resin.

2. The piezoelectric oscillator according to claim 1, the lead frame having the island portion and external terminal portions separated from the island portion, at least a portion of the lead frame being deformed such that a region of the island portion that is coupled to at least the semiconductor device is positioned further away from the transparent lid than the external terminal portions.

3. The piezoelectric oscillator according to claim 2, the island portion having holding lead portions that have a smaller width than the island portion and that extend outward, and the deformation being provided at the holding lead portions.

4. The piezoelectric oscillator according to claim 3, portions of the holding lead portions having deformation portions that facilitate deformation.

5. The piezoelectric oscillator according to claim 4, the deformation portions being defined by slits that penetrate the island portion at opposite sides of the holding lead portions.

6. The piezoelectric oscillator according to claim 1, the resonator package being fixed with at least three protrusion surfaces abutting against the island portion, the protrusion surfaces slightly protruding.

7. A mobile phone apparatus using a piezoelectric resonator that obtains a control clock signal, the piezoelectric resonator including a resonator package having a transparent lid, a piezoelectric container formed of a plurality of insulating substrates, and a mounting terminal in which a piezoelectric resonator element is housed, and a semiconductor device, in which an oscillation circuit that is electrically coupled to the resonator package is incorporated, the resonator package and the semiconductor device being fixed to corresponding different surfaces of an island portion of a lead frame, a terminal portion of the semiconductor device being connected to the mounting terminal of the resonator package by bonding wire, and resin molding being performed so that a transparent lid of the resonator package is exposed to an outside and each of the semiconductor device and resonator package are contained within a same body of resin.

8. An electronic apparatus using a piezoelectric resonator that obtains a control clock signal, the piezoelectric resonator including a resonator package having a transparent lid, a piezoelectric container formed of a plurality of insulating substrates, and a mounting terminal in which a piezoelectric resonator element is housed, and a semiconductor device in which an oscillation circuit that is electrically coupled to the resonator package is incorporated, the resonator package and the semiconductor device being fixed to corresponding different surfaces of an island portion of a lead frame, a terminal portion of the semiconductor device being connected to the mounting terminal of the resonator package by bonding wire, and resin molding being performed so that a transparent lid of the resonator package is exposed to an outside and each of the semiconductor device and resonator package are contained within a same body of resin.

* * * * *